(12) United States Patent
Pan et al.

(10) Patent No.: US 7,196,371 B2
(45) Date of Patent: Mar. 27, 2007

(54) FLASH MEMORY

(75) Inventors: Jui-Yu Pan, Pingtung County (TW); Cheng-Yuan Hsu, Hsinchu (TW); I-Chun Chuang, Taipei (TW); Chih-Wei Hung, Hsin-chu (TW)

(73) Assignee: Powerchip Semiconductor Corp., Hsinchu (TW)

( * ) Notice: Subject to any disclaimer, the term of this patent is extended or adjusted under 35 U.S.C. 154(b) by 0 days.

(21) Appl. No.: 11/161,994

(22) Filed: Aug. 25, 2005

(65) Prior Publication Data
US 2006/0175654 A1 Aug. 10, 2006

(30) Foreign Application Priority Data
Feb. 4, 2005 (TW) .............. 94103556 A

(51) Int. Cl.
*H01L 29/788* (2006.01)
(52) U.S. Cl. .................... 257/315; 257/316
(58) Field of Classification Search .......... 257/315, 257/316
See application file for complete search history.

(56) References Cited
U.S. PATENT DOCUMENTS

| | | | | |
|---|---|---|---|---|
| 5,422,504 A | * | 6/1995 | Chang et al. | 365/185.15 |
| 6,081,449 A | * | 6/2000 | Sekariapuram et al. | 365/185.05 |
| 6,091,102 A | * | 7/2000 | Sekariapuram et al. | 257/316 |
| 6,093,945 A | * | 7/2000 | Yang | 257/317 |
| 6,724,029 B2 | * | 4/2004 | Hsu et al. | 257/296 |
| 6,875,660 B2 | * | 4/2005 | Hung et al. | 438/279 |
| 2002/0072170 A1 | * | 6/2002 | Lam | 257/317 |
| 2002/0109179 A1 | * | 8/2002 | Johnson et al. | 257/314 |
| 2005/0280073 A1 | * | 12/2005 | Huang et al. | 257/315 |
| 2005/0282337 A1 | * | 12/2005 | Shyu et al. | 438/257 |
| 2006/0102948 A1 | * | 5/2006 | Chang et al. | 257/315 |
| 2006/0157773 A1 | * | 7/2006 | Yu et al. | 257/314 |

* cited by examiner

*Primary Examiner*—Evan Pert
(74) *Attorney, Agent, or Firm*—Jianq Chyun IP Office

(57) ABSTRACT

A method for fabricating a flash memory is described. A mask layer having openings to expose a portion of the substrate is formed on the substrate. A tunneling dielectric layer is formed at the bottom surface of the openings. Conductive spacers are formed on the sidewalls of the openings. The conductive spacers are patterned to form a plurality of floating gates. A plurality of buried doped regions is formed in the substrate under the bottom surface of the openings. An inter-gate dielectric layer is formed over the substrate. A plurality of control gates is formed over the substrate to fill the openings. The mask layer is removed to form a plurality of memory units. A plurality of source regions and drain regions are formed in the substrate beside the memory units.

9 Claims, 6 Drawing Sheets

FLASH MEMORY

CROSS-REFERENCE TO RELATED APPLICATION

This application claims the priority benefit of Taiwan application serial no. 94103556, filed on Feb. 4, 2005. All disclosure of the Taiwan application is incorporated herein by reference.

BACKGROUND OF THE INVENTION

1. Field of the Invention

The present invention relates to a memory device. More particularly, the present invention relates to a flash memory device and a fabrication method thereof.

2. Description of Related Art

Electrically erasable programmable read only memory (EEPROM) is a type of non-volatile memory that allows multiple data reading, writing and erasing operations. In addition, the stored data will be retained even after power to the device is removed. With these advantages, electrically erasable programmable read only memories have been broadly applied in personal computers and electronic equipment.

A floating gate and a control gate of a typical flash memory device are fabricated with doped polysilicon. The floating gate is isolated from the control gate with an inter-gate dielectric layer, and is isolated from the substrate with a tunneling dielectric layer. The tunneling dielectric layer, the floating gate, the inter-gate dielectric layer and the control gate constitute a stacked-gate flash memory device. During a writing/erasing operation by a flash memory device, bias voltages are applied to the control gate, the source region and the drain region to inject electrons into the floating gate or to eject electrons from the floating gate. During a reading operation by a flash memory device, an operating voltage is applied to the control gate. The charge carrying state of the floating gate then affects the opening/closing of the channel underneath, in which the stored data as being [0] or [1] is determined.

When the gate couple ratio (GCR) between the control gate and the floating gate becomes higher, a lower operating voltage is required for operating the memory device. Therefore, the current industry is focused on increasing the capacitance of the inter-gate dielectric layer in order to raise the gate couple ratio. Generally speaking, increasing the capacitance of the gate dielectric layer includes increasing the area between the control gate and the floating gate. However, due to the limitations inherent in the manufacturing process, for example, the patterning process for the control gate and the floating, to further increase the area between the control gate and the floating gate is restricted. Consequently, to increase the level of integration of the device is thereby hindered.

SUMMARY OF THE INVENTION

Accordingly, the present invention provides a flash memory device and a fabrication method thereof for increasing the gate couple ratio and the integration of the device.

The present invention provides a fabrication method for a flash memory device. This method includes providing a substrate. A mask layer is formed on the substrate, wherein the mask layer has a plurality of openings, exposing a part of the substrate. A tunneling dielectric layer is formed at the bottom of the opening. A plurality of conductive stripe-shaped spacers is formed on the sidewall of the opening. These stripe-shaped spacers are then patterned to form a plurality of floating gates. Further using the floating gates as a mask, a plurality of buried doped regions is formed in the substrate at the bottom of the openings. An inter-gate dielectric layer is then formed over the substrate. A plurality of control gates is formed over the substrate filling the opening. The mask layer is subsequently removed to complete the formation of a plurality of memory units. Thereafter, a plurality of source regions and a plurality of drain regions are formed in the substrate beside the memory units.

According to the fabrication method of a flash memory device of one embodiment of the present invention, forming the plurality of strip-shaped conductive spacers on the sidewall of the openings further includes forming a first conductive layer over the substrate, followed by performing an etching process to remove a portion of the first conductive layer using a self-aligned method to form these stripe-shaped conductive spacers on the sidewall of the openings.

According to the fabrication method of a flash memory device of one embodiment of the present invention, filling the openings to form the plurality of the control gates on the substrate further includes forming a second conductive layer on the substrate, followed by removing a portion of the second conductive layer outside the second opening to form the control gates, wherein removing the second conductive layer includes conducting an etching process or a chemical mechanical polishing process.

According to the fabrication method of a flash memory device of one embodiment of the present invention, wherein the etching selectivity of the material, for example, silicon nitride, used in forming the mask layer is different from that used in forming the floating gate and the control gate.

According to the fabrication method of a flash memory device of one embodiment of the present invention, the method further comprises forming a dielectric layer over the substrate, followed by forming a plurality of source region contacts and a plurality of drain region contacts in the dielectric layer.

Since according to the fabrication method for a flash memory device of the present invention, the floating gate is curved, the area between the floating gate and the control gate of the flash memory device is greater compared to that of the conventional stacked-gate flash memory device. Therefore, the gate couple ratio between the floating gate and the control gate is increased. Further, two memory cells is formed in one memory unit according to the present invention, and the two memory cells share one control gate. The level of integration of the device can thereby improve.

The present invention provides a flash memory device, wherein the memory device includes a substrate, a plurality of buried doped regions, a plurality of source regions, a plurality of drain regions, a plurality of floating gates, a plurality of control gates, a plurality of inter-gate dielectric layers, a plurality of tunneling dielectric layers. The buried doped regions are disposed in parallel in the substrate, wherein each buried doped region extends along one direction. The source regions and the drain regions are respectively disposed in the substrate beside both sides of the buried doped regions. The floating gates are disposed over the substrate between the buried doped regions the source regions and between the doped regions and the drain regions. The control gates are disposed between the buried doped regions and the floating gates, filling the space between the neighboring floating gates. Further, each control gates extends along the direction discussed above. The inter-gate dielectric layer is disposed between the control gates and the floating gates, and between the control gates and the buried doped regions. The tunneling dielectric layer is disposed between the control gates and the substrate.

The flash memory device of an embodiment of the invention further includes a plurality of source region contacts and a plurality of drain region contacts, wherein the source region contacts are disposed above the substrate and are electrically connected with the source regions, while the drain region contacts are disposed above the substrate and are electrically connected with the drain regions.

According to the flash memory device and the fabrication method thereof of an embodiment of the present invention, the dopant type of the substrate is a first conductive type, while the dopant types of the drain region and the buried doped region are the second conductive type.

According to the flash memory device and the fabrication method thereof of an embodiment of the present invention, the above-mentioned substrate comprises a deep doped region of the second conductive type and a shallow doped region of the first conductive type, wherein the shallow doped region is configured in the deep doped region, and the source region, the drain region and the buried doped region are configured in the shallow doped region.

According to the flash memory device and the fabrication method thereof of an embodiment of the present invention, the material for constituting the above-mentioned inter-gate dielectric layer includes silicon oxide/silicon nitride/silicon oxide or silicon oxide.

According to the flash memory device and the fabrication method thereof of an embodiment of the present invention, the material for constituting the above-mentioned floating gates and control gates includes doped polysilicon.

Since one side of each floating gate of the flash memory device of the invention is curved, the area between the floating gate and the control gate of the flash memory device of the present invention is greater compared to that of the conventional stacked gate flash memory device. The gate-couple ratio between the floating gate and the control gate is thereby increased to raise the efficiency of the device.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
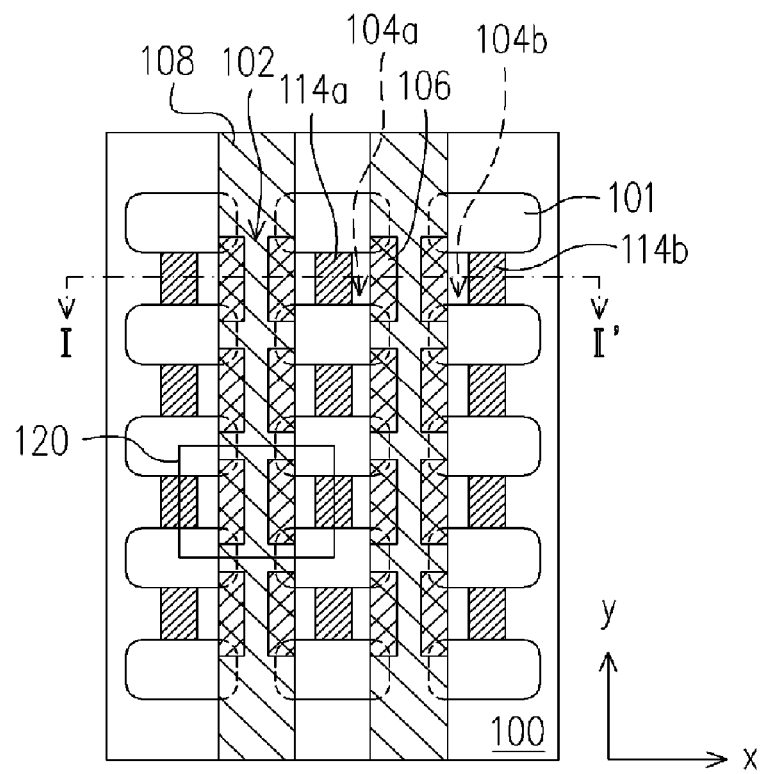
FIG. 1 is a schematic, top view of a portion of a flash memory device according to one embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
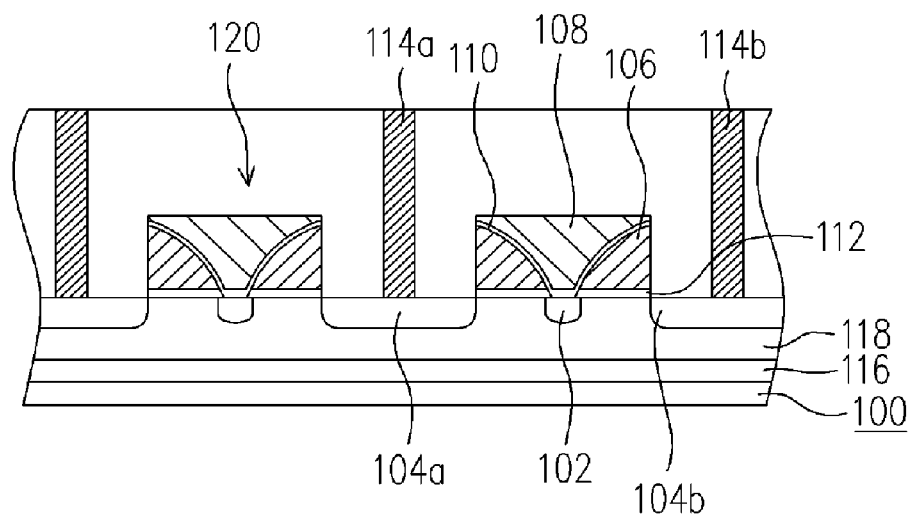
FIG. 2 is a cross-sectional view of FIG. 1 along the cutting line I–I' (X-direction).

FIG. 1 is a schematic, top view of a portion of a flash memory device according to one embodiment of the present invention. FIG. 2 is a cross-sectional view of FIG. 1 along the cutting line I–I' (X-direction).

Referring concurrently to FIGS. 1 and 2, the flash memory device includes a substrate 100, a plurality of buried doped regions 102, a plurality of source regions 104a, a plurality of drain regions 104b, a plurality of floating gates 106, a plurality of control gates 108, a plurality of inter-gate dielectric layers 110, a plurality of tunneling dielectric layer 112. In this embodiment, the flash memory device of the present invention further includes a plurality of source region contacts 114a and a plurality of drain region contacts 114b.

Further, the substrate 100 is disposed with a plurality of isolation structures 101 to define the active region. Beside, in this embodiment, the substrate 100 is also configured with a deep doped region 116 and a shallow doped region 118, wherein the shallow doped region 118 is configured in the deep doped region 116. In one embodiment, the dopant type of the substrate 100 is a p-type, the dopant type of the deep doped region 116 is an n-type and the dopant type of the shallow doped region 118 is p-type.

The buried doped regions 102 are disposed in parallel along one direction, for example, along the Y direction in the substrate 100. In one embodiment, the dopant type of the buried doped regions 102 is, for example, an n-type, and the buried doped region 102 is disposed in the shallow doped region 118.

The source regions 104a and the drain regions 104b are respectively disposed in the substrate 100 beside both sides of the buried doped regions 102. In one embodiment, the dopant type of the source regions and the drain regions, which are configured in the shallow doped region 118 is, for example, the n-type.

The floating gates 106 are disposed above the substrate 100 between the buried doped regions 102 and the source regions 104a and between the buried doped regions 102 and the drain regions 104b, wherein a material for constituting the floating gate 106 includes but not limited to doped polysilicon. Each of the floating gates 106 has a smooth curved side.

Moreover, the control gates 108 are disposed above the buried doped regions 102 and the floating gates 106, filling the gap between two neighboring floating gates 106. Each of the control gates 108 extends along the above direction, for example, the Y-direction. A material for constituting the control gate includes but not limited to doped polysiliocn.

The inter-gate dielectric layers 110 are disposed between the control gates 108 and the floating gates 106 and between the control gates 108 and the buried doped regions 102. The material of the control gates 110 includes, for example, a silicon oxide/silicon nitride/silicon oxide stacked material, silicon oxide or other appropriate materials. Being defined by the smooth curved sides of the floating gates 106, each inter-gate dielectric layer 110 has two cured wings extending along the curved sides of the floating gates 106.

Further, the tunneling dielectric layer 112 is disposed between the floating gate 106 and the substrate 100. The tunneling dielectric layer 112 is formed with a material that includes silicon oxide or other materials.

Beside, the source region contacts 114a and the drain region contacts 114b disposed above the substrate 100 are electrically connected with the source regions 104a and the drain regions 104b, respectively.

According to the above embodiment, the flash memory device of the present invention is formed with a plurality of memory units 120, wherein each memory unit 120 includes at least two memory cells. In other words, since two memory cells share one control gate, the level of device integration is increased. Moreover, one side of the floating gate of the flash memory device of the invention is curved. The gate couple ratio is increased to enhance the efficiency of the device.

FIGS. 3A through 3E are schematic cross-sectional views showing the steps for fabricating a flash memory according to an embodiment of the present invention. FIGS. 4A through 4E are schematic cross-sectional views of FIGS. 3A to 3E along the cutting lines II–II' showing the steps for fabricating a flash memory.

Figure 3A:
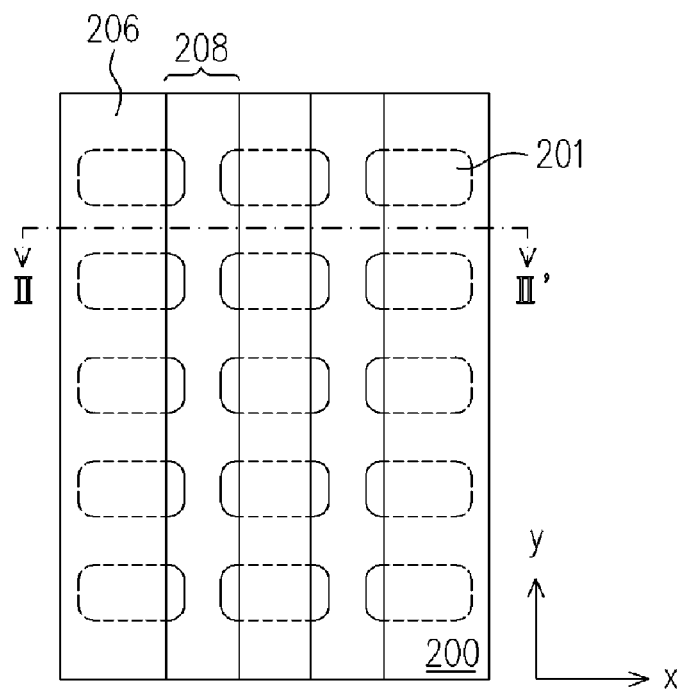
FIGS. 3A through 3E are schematic cross-sectional views showing the steps for fabricating a flash memory device according to an embodiment of the present invention.
Figure 4A:
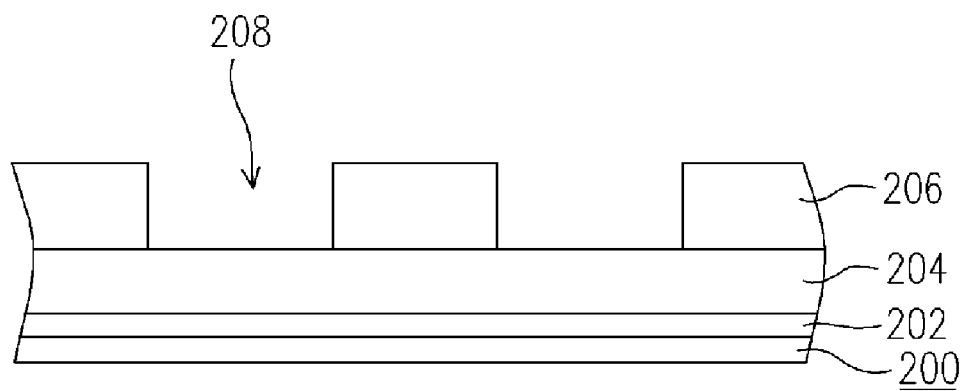
FIGS. 4A through 4E are schematic cross-sectional views of FIGS. 3A to 3E along the cutting lines II–II' showing the steps for fabricating a flash memory device.

Referring to both FIGS. 3A and 4A, the fabrication of the flash memory device of the present invention includes providing a substrate 200, wherein the substrate 200 is already formed with a plurality of isolation structures 201 to define the active regions. The substrate 200 is, for example, a p-type substrate. Thereafter, a deep doped region 202 is formed in the substrate 200, wherein the dopant type of the deep doped region 202 is, for example, an n-type. A shallow doped region 204 is then formed in the deep doped region 202, and the dopant type of the shallow doped region 204 is, for example, the p-type.

A mask layer 206 is further formed over the substrate 200. The etching selectivity of the material of the mask layer 206 is different from those of the floating gate and the control gate. The material used in forming the mask layer 206 includes but not limited to silicon nitride. The mask layer 206 is formed by chemical vapor deposition (CVD), for example.

The mask layer 206 is then patterned to form a plurality of openings 208. These openings 208 extend along the Y direction, for example, to form a disply of stripes.

Figure 3B:
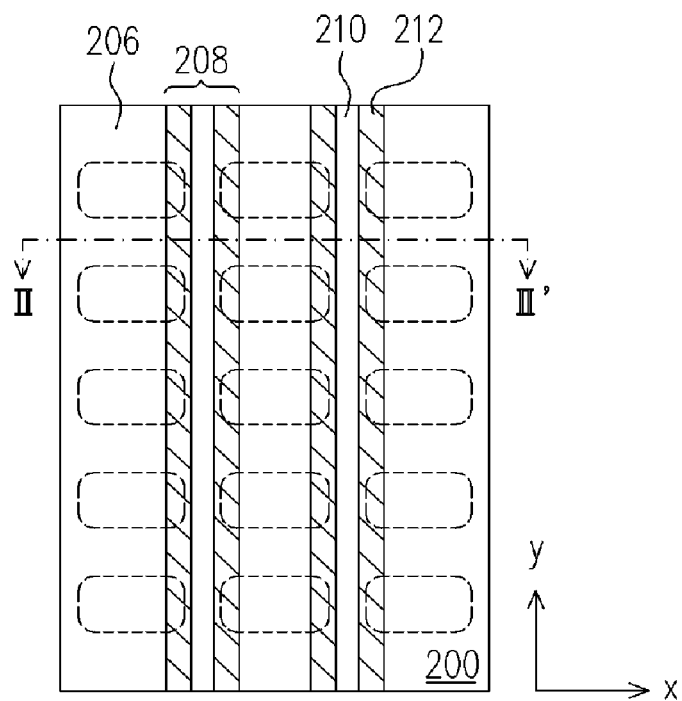
Figure 4B:
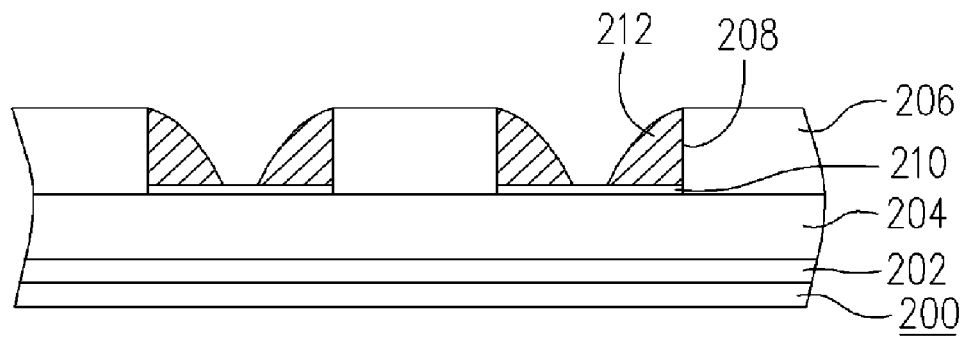

Referring to both FIGS. 3B and 4B, a tunneling dielectric layer 210 is formed at the bottom of each opening 208. A material that constitutes the tunneling dielectric layer 210 is silicon oxide, for example, and the tunneling dielectric layer 210 is formed by a method that includes thermal oxidation.

Thereafter, a plurality of stripe-shaped conductive spacers 212 is formed on the sidewall of the openings 208. These stripe-shaped conductive spacers 212 extend along the Y-direction, for example. Forming the stripe-shaped conductive spacers 212 include forming a conductive layer, for example, a doped polysilicon layer, followed by performing a self-aligned etching process to remove a part of the conductive layer to form the conductive spacers 212. The conductive layer is formed by, for example, forming an undoped polysilicon layer using chemical vapor deposition followed by performing an ion implantation process or performing chemical vapor deposition along with an in-situ doping. Such conductive spacers 212 are configured to have smooth curved outward sides.

Figure 3C:
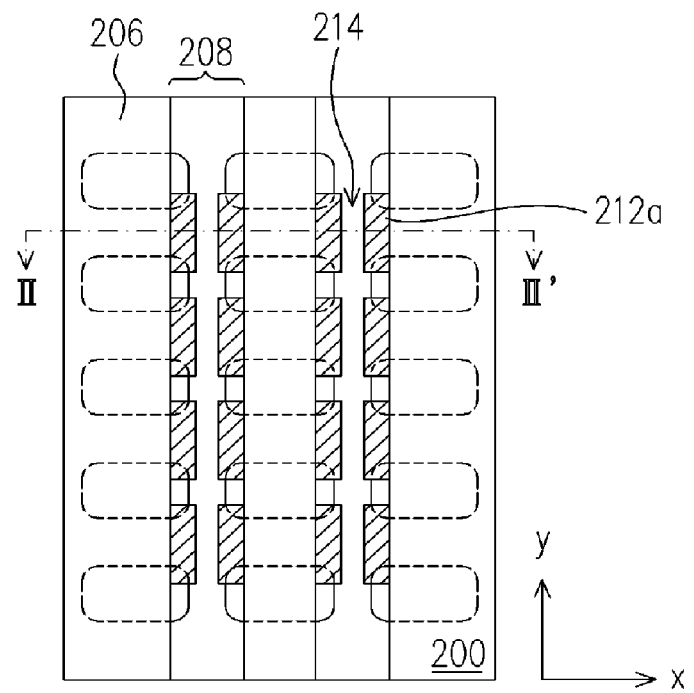
Figure 4C:
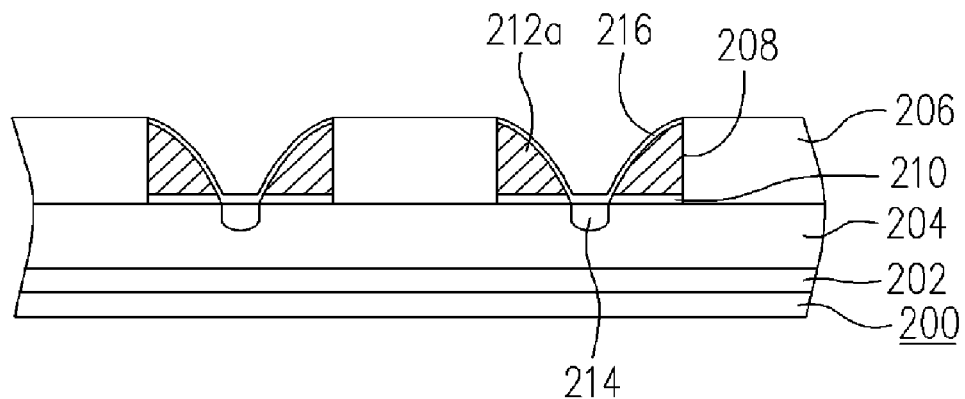

Referring to both FIGS. 3C and 4C, these conductive spacers 212 are then patterned to form a plurality of floating gates 212a. These floating gates 212a are arranged in a row/column array. Thereafter, the floating gates 212a are used as a mask to form a plurality of doped regions 214 in the substrate 200 at the bottom of the opening 208. The buried doped region 214 is formed by ion implantation, for example to implant n-type dopants.

Thereafter, an inter-gate dielectric layer 216 is formed over the substrate 200. The inter-gate dielectric layer 216 has a bottom in contact with the buried doped region 214 and two wings extending alone two adjacent conductive spacers 212 respectively. Because the spacers 212 have curved outward sides, the two wings of the inter-gate dielectric layer are configured curved. In such a way, the inter-gate dielectric layer achieves larger area than that has planar shape. The material constituting the inter-gate dielectric layer 216 includes silicon oxide/silicon nitride/silicon oxide type of stacked material. The inter-gate dielectric layer 216 can also form with silicon oxide, silicon oxide/silicon nitride, etc. The inter-gate dielectric layer 216 is formed by performing thermal oxidation to form a silicon nitride layer using chemical vapor deposition, followed by using a wet H2/O2 gas to oxidize a part of the silicon nitride layer.

Figure 3D:
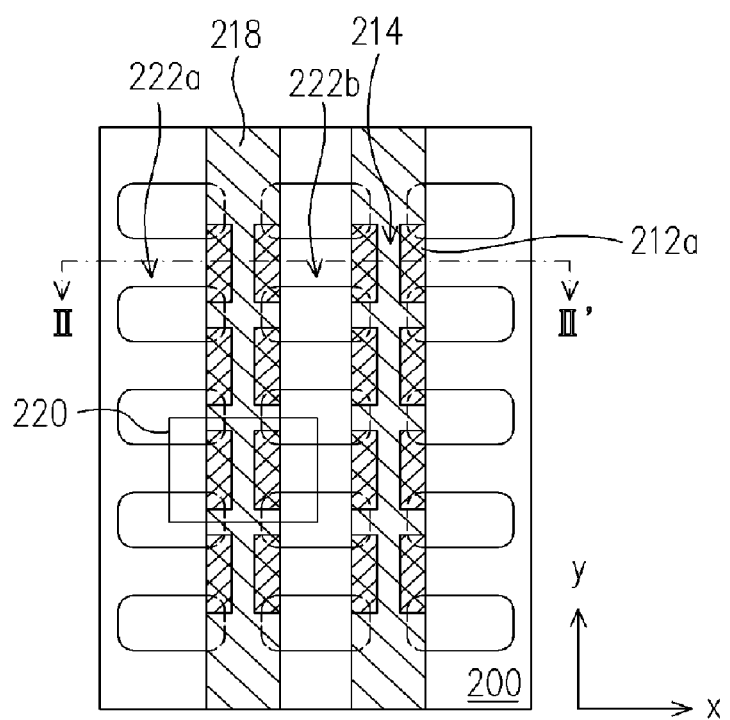
Figure 4D:
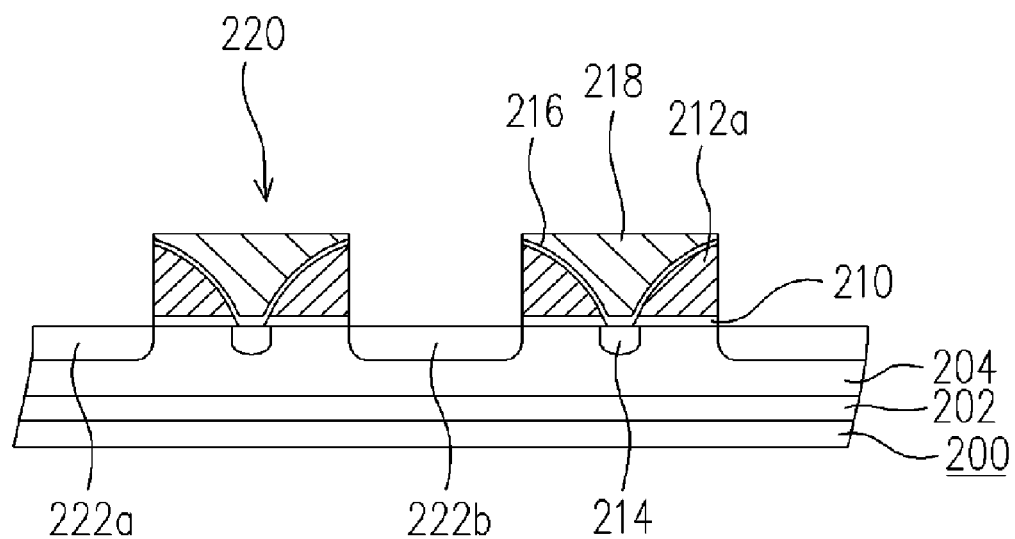

Continuing to FIGS. 3D and 4D, a plurality of control gates 218 is formed over the substrate 200 filling these opening 208. The control gates 218 extend along the Y-direction, for example. The control gates 218 are formed with doped polysilicon or other appropriate conductive materials.

Thereafter, the mask layer 206 is removed to form a plurality of memory units 220. Particularly, each memory unit 220 comprises two memory cells and these two memory cells share a control gate 218.

A plurality of source regions 222a and a plurality of drain regions 222b are formed in the substrate 200 beside the memory units 220. The source regions 222a and the drain regions 222b are formed by ion implantation and the implanted dopants are n-type dopants, for example. Further, it is worth to note that two neighboring memory units 220 share a common source/drain region in this embodiment.

Figure 3E:
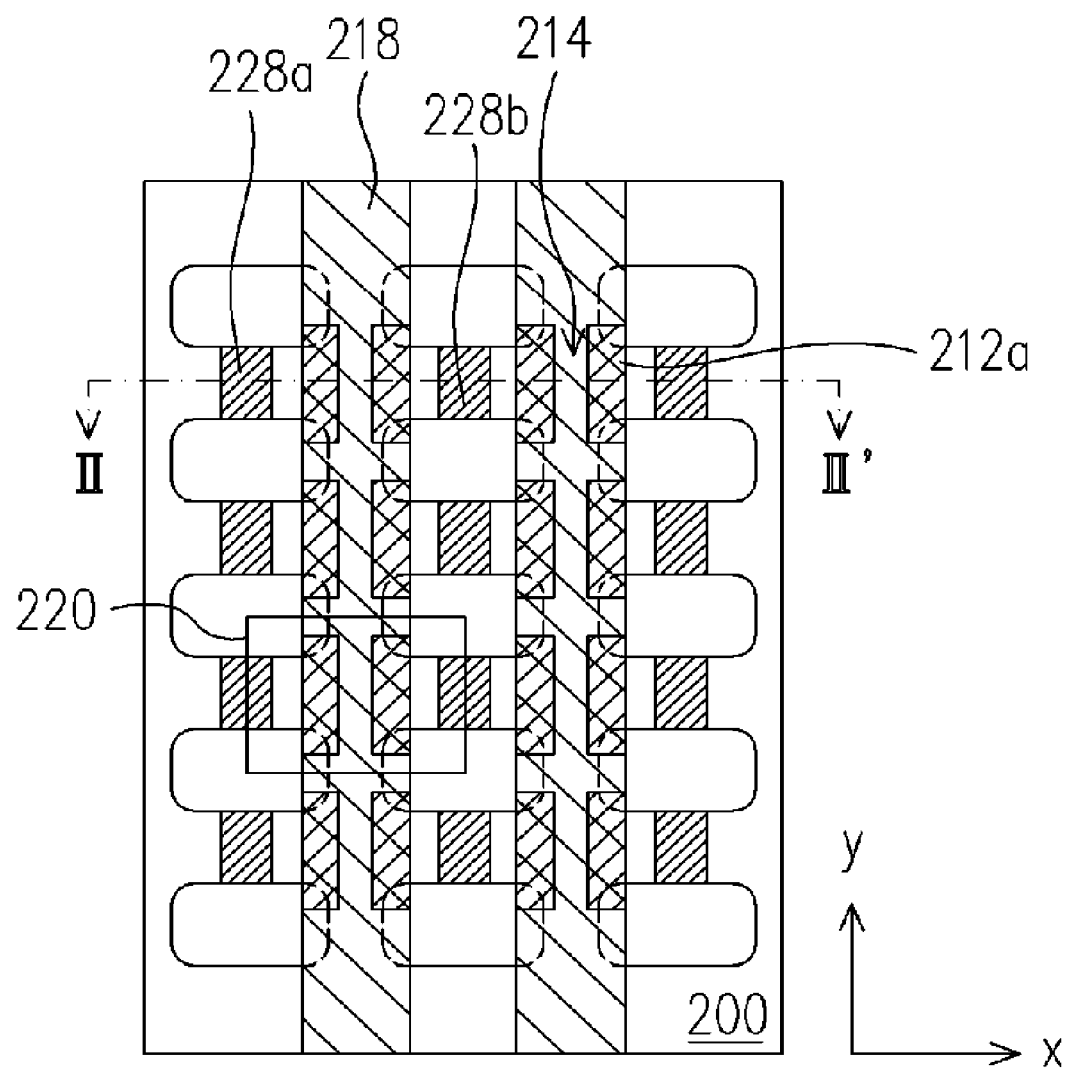
Figure 4E:
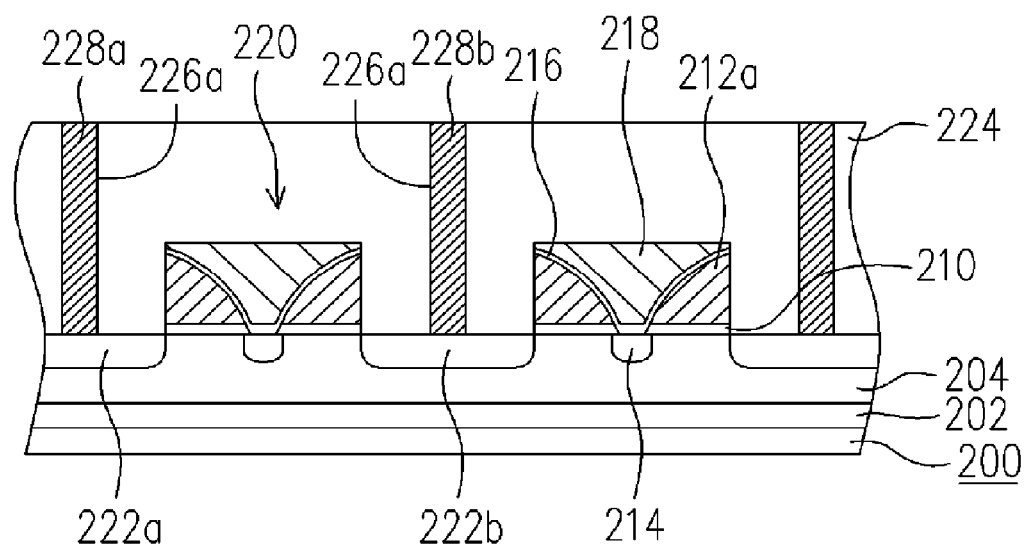

In the embodiment of the invention,after forming the source regions 222a and the drain regions 222b, the fabrication method for a flash memory device further includes forming a dielectric layer 224 over the susbtrate 220 as shown in FIGS. 3E and 4E. The material of the dielectric layer 224 includes silicon oxide or other appropriate materials. The dielectric layer 224 is formed by chemical vapor depositions, for example. A plurality of source region contact openings 226a and a plurality of drain region contact openings 226b are formed in the dielectric layer 224. The source region contact openings 226a and the drain region contact openings 226b are formed by performing an etching process, for example. Source region contacts 228a and drain region contacts 228b are respectively formed in the source region contact openings 222a and the drain region contact openings 226b to electrically connect with the source regions 222a and the drain regions 222b. The source region contacts 228a and the drain region contacts 228b are formed with tungsten or other appropriate materials, and they are formed by chemical vapor deposition, for example.

According to the fabrication method for a flash memory device of the present invention, one side of the floating gate is curved. Therefore, comparing with the conventional stacked gate flash memory device, the area between the floating gate and the control gate of the flash memory device of the invention is larger. The gate couple ratio between the control gate and the floating gate is thereby increased to raise the efficiency of the device.

Further, according to the present invention, a single memory unit is formed with two memory cells, and the two memory cells share a common control gate. Thus, the integration of the device is increased.

Moreover, the flash memory device formed according to the present invention can rely on the hot carrier injection to perform the programming operation and the Fowler-Nordheim tunneling to perform the erasing operation.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A flash memory device, comprising:
    a substrate;
    a plurality of buried doped regions, disposed in parallel in the substrate, wherein the buried doped regions extend along a direction;
    a plurality of source regions and a plurality of drain regions respectively disposed in the substrate beside both sides of the buried doped regions;
    a plurality of floating gates, disposed over the substrate between the buried doped regions and the source regions, and between the buried doped regions and the drain regions, wherein each floating gate is a conductive spacer having a curved side;
    a plurality of control gates, disposed over the buried doped regions and the floating gates, wherein each control gate fills a space between two neighboring floating gates, and each control gate extends along the direction;
    a plurality of inter-gate dielectric layers, disposed between the control gates and the floating gates and between the control gates and the buried doped regions; and
    a plurality of tunneling dielectric layers, disposed between the floating gates and the substrate.

2. The flash memory device of claim 1, further comprising:
    a plurality of source region contacts disposed over the substrate to electrically connect with the source regions; and
    a plurality of drain region contacts disposed over the substrate to electrically connect with the drain regions.

3. The flash memory device of claim 1, wherein a dopant type of the substrate is a first conductive type, and a dopant type of the source region, the drain region and the buried doped region is a second conductive type.

4. The flash memory device of claim 3, further comprising a shallow doped region of the first conductive type disposed in the substrate, and the source region, the drain region and the buried doped region are disposed in the shallow doped region.

5. The flash memory device of claim 4, further comprising a deep doped region of the second conductive type disposed in the substrate, and the shallow doped region is disposed in the deep doped region.

6. The flash memory device of claim 1, wherein a material constituting the inter-gate dielectric layers comprise silicon oxide/silicon nitride/silicon oxide.

7. The flash memory device of claim 1, wherein a material constituting the inter-gate dielectric layers comprises silicon oxide.

8. The flash memory device of claim 1, wherein a material constituting the floating gates and the control gates comprises doped polysilicon.

9. The flash memory device of claim 1, wherein each of the inter-gate dielectric layers has a bottom in contact with one of the buried doped regions and two wings extending along two adjacent conductive spacers respectively, the two wings of the inter-gate dielectric layer being configured curved.

* * * * *